United States Patent [19]

Naarmann et al.

[11] 4,360,644
[45] Nov. 23, 1982

[54] PREPARATION OF ELECTRICALLY CONDUCTIVE POLYAROMATICS

[75] Inventors: Herbert Naarmann, Wattenheim; Dieter Naegele, Worms; Klaus Penzien, Frankenthal; Johannes Schlag, Ludwigshafen, all of Fed. Rep. of Germany

[73] Assignee: BASF Aktiengesellschaft, Fed. Rep. of Germany

[21] Appl. No.: 221,731

[22] Filed: Dec. 31, 1980

[30] Foreign Application Priority Data

Jan. 7, 1980 [DE] Fed. Rep. of Germany ....... 3000379

[51] Int. Cl.$^3$ .......................... C08G 61/10; C08L 3/00
[52] U.S. Cl. ................................. 525/390; 252/500; 252/518; 524/159; 524/226; 524/408; 524/410; 524/611; 525/397; 525/416; 528/480; 528/485; 528/486; 528/487; 528/492

[58] Field of Search ..................... 525/390, 397, 416; 524/611; 252/500, 518

[56] References Cited

U.S. PATENT DOCUMENTS 3,396,146  8/1968  Schmukler ......................... 525/390

Primary Examiner—Harold D. Anderson
Attorney, Agent, or Firm—Keil & Witherspoon

[57] ABSTRACT

A process for the preparation of electrically conductive polyaromatics having conductivities greater than $10^{-2}$ S/cm, wherein from 0.5 to 15% by weight of an oxidizing Lewis acid, e.g. antimony pentafluoride or arsenic pentafluoride, or their $NO^+$- or $NO_2^+$-salts, or a nitroaromatic, e.g. trinitrophenol or trinitrobenzenesulfonic acid, and/or a fluorine derivative, e.g. $CF_3$—COOH, or an acid, e.g. sulfuric acid, nitric acid or perchloric acid, is added to a polyaromatic, in the absence of moisture.

4 Claims, No Drawings

PREPARATION OF ELECTRICALLY CONDUCTIVE POLYAROMATICS

The present invention relates to a process for the preparation of electrically conductive polyaromatics having conductivities greater than $10^{-2}$ S/cm.

The preparation of polyaromatics by oxidative coupling has been disclosed, for example in Macromolecular Syntheses Collective (published by John Wiley and Sons), 1 (1979), 109–110, and Naturwissenschaften, 56 (1969), 308–313. Furthermore, polyaromatics may be prepared by stepwise polycondensation as described by R. Gehm and W. Kern, Makromol. Chem. 7 (1951), 46–61, this method giving particularly uniform methyl-substituted derivatives, with para-chain linkages, free from contamination by ortho- or meta-linked polymers. The polyaromatics may also be prepared as described by P. R. Schildneck et al., J. Amer. Chem. Soc. 53 (1931), 2373.

It is an object of the present invention to convert the polyaromatics, known per se, into electrically conductive polymers, having conductivities greater than $10^{-2}$ S/cm, by means of additives.

We have found that this object is achieved, according to the invention, by adding to the polyaromatic, in the absence of moisture, from 0.5 to 15% by weight, based on polyaromatic employed, of an oxidizing Lewis acid, eg. antimony pentafluoride or arsenic pentafluoride, or their NO+- or NO2+-salts, or a nitroaromatic, eg. trinitrophenol or trinitrobenzenesulfonic acid, and/or a fluorine derivative, eg. CF3—COOH, or an acid, eg. sulfuric acid, nitric acid or perchloric acid. In a preferred embodiment, the oxidizing Lewis acids are added in tetrahydrofuran, dimethoxyglycol, anthracene, naphthalene or 2-methylstyrene, in each case in a molar ratio of from 1:1 to 1:50, preferably from 1:2 to 1:3.

For the purposes of the invention, polyaromatics are the conventional relatively high molecular weight products whose chains consist entirely of aromatic systems which are coupled to one another and may or may not carry substituents R, in accordance with the general formula:

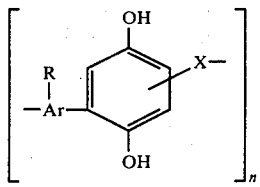

and which are obtained from benzene or substituted benzenes, and benzoquinone or derivatives thereof, by a Friedel-Crafts reaction under dehydrogenating conditions, or by other dehydrogenating or oxidative coupling processes, followed by reduction. Polyaromatics in which the linkage of the aromatic systems is linear are preferred. The polyaromatics have molecular weights of from 200 to 5,000, ie. n is from 1 to 50. The preparation of the polyaromatics may be carried out in accordance with the literature quoted at the outset. In the above formula, X is Ar—R, Ar is an aromatic system, preferably phenylene, and R is H or an aliphatic, cycloaliphatic or aromatic group, or a functional group, for example CN or

The electrical conductivities are measured at 30° C. by the method of F. Beck, Ber. Bunsengesellschaft, Phys. Chem. 68 (1964), 558–567, and are recorded in S/cm. The novel conductive polyaromatics have conductivities greater than $10^{-2}$ S/cm.

In the process according to the invention, from 0.5 to 15% by weight, based on polyaromatic employed, of an oxidizing Lewis acid, eg. antimony pentafluoride or arsenic pentafluoride, or their NO+- or NO2+-salts, or a nitroaromatic, eg. trinitrophenol or trinitrobenzenesulfonic acid, and/or a fluorine derivative, eg. CF3-COOH, or an acid, eg. sulfuric acid, nitric acid or perchloric acid, is added to the polyaromatic, in the absence of moisture.

The additives are incorporated in the absence of moisture, preferably under an argon atmosphere. It is preferred to use an auxiliary fluid, such as tetrahydrofuran, nitromethane, CCl4 or CHCl3, in each case in a molar ratio of from 1:1 to 1:50, preferably from 1:2 to 1:3; after the additive has been incorporated, the fluid is stripped off under reduced pressure at below 30° C.

Increases in electrical conductivity of several orders of magnitude can be achieved by the stated additives. The initial conductivity of the polyaromatics prepared by oxidative coupling is from about $10^{-12}$ to $10^{-8}$ S/cm. The polyaromatics prepared by condensation have initial conductivities of less than $10^{-12}$ S/cm, but after addition of the additives according to the invention give conductivities of not less than $10^{-2}$ S/cm.

The electrically conductive polyaromatics prepared according to the invention and having conductivities of not less than $10^{-2}$ S/cm may be used for the antistatic treatment of plastics, for the production of solar cells, for the conversion and fixing of radiation and for the production of electrical and magnetic switches. The addition of the strong Lewis acid to the polyaromatic results in the formation of a p-conductor.

In the Examples which follow, parts are by weight. The number of repeat units n (which indicates the chain length of the polyaromatics) is obtained by end group analysis, through infrared determination of the ratio of monofunctional terminal groups to difunctional non-terminal groups.

EXAMPLES 1 TO 7

The type and amount of additive shown is added to 10 parts of a polyaromatic under an argon atmosphere, with exclusion of moisture. The electrical conductivity is measured by the method of F. Beck, loc. cit.

| No. | Polyaromatic, type and amount | $\left[\begin{array}{c} \text{structure with } R-Ar-, OH, OH, X- \end{array}\right]_n$ | Doping agent type and amount | | Conductivity, S/cm, at 30° C. | |
|---|---|---|---|---|---|---|
| | | | | | before doping | after doping |
| 1 | 10 parts, n about 3 (2) | | $SbF_5$ | 1.0 | $10^{-5}$ | $2.9 \times 10^{-2}$ |
| 2 | 10 parts, n about 5 (2) | | $SbF_5$ | 1.5 | " | $3.2 \times 10^{-2}$ |
| 3 | 10 parts, n about 10 (2) | | $SbF_5$ | 4.0 | " | $2.5 \times 10^{-1}$ |
| 4 | 10 parts, n about 15 (2) | | $NO^+SbF_6$ | 1.5 | $10^{-6}$ | $1.9 \times 10^{-1}$ |
| 5 | 10 parts, n about 10 (2) | | $NO^+AsF_6$ | 3.0 | $10^{-6}$ | $0.8 \times 10^{+2}$ |
| 6 | 10 parts, n about 10 (2) | | $H_2SO_4$ | 1.0 | $10^{-6}$ | $1.4 \times 10^{-2}$ |
| 7 | 10 parts, n about 20 (2) | | $CF_3COOH$ | 1.5 | $10^{-6}$ | $3.6 \times 10^{-2}$ |
| Comparative experiment | 10 parts, n about 3 (1) (polyphenylene) | | $SbF_5$ | 1.0 | $10^{-12}$ | $7.1 \times 10^{-1}$ |
| 8 | 10 parts, n = 1 (2a) | | | 1.0 | $10^{-5}$ | $10^{-2}$ |

Notes on Table
(1) Polyaromatic prepared by the method of R. Gehm et al., loc. cit.
(2) Prepared by the method of P. R. Schildneck et al, J. Amer. Chem. Soc. 53 (1931), 2373, followed by oxidative coupling as described in Macromolecular Syntheses Collective, 1 (1979), 109–110

In Examples 1 to 8, $X = -\overset{R}{\underset{|}{Ar}}-$,

In Examples 1 to 5 and 8, $-\overset{R}{\underset{|}{Ar}}- = -\phantom{}\bigcirc\phantom{}$ In Example 6, $-\overset{R}{\underset{|}{Ar}}- = -\bigcirc-\bigcirc-$ In Example 7, $-\overset{R}{\underset{|}{Ar}}-$ is 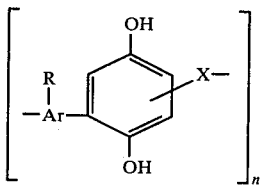

We claim:
1. A process for the preparation of an electrically conductive polyaromatic having an electrical conductivity greater than $10^{-2}$ Siemens/cm, said polyaromatic having the formula

$$\left[\begin{array}{c} R \\ | \\ -Ar- \end{array} \text{(benzene ring with } OH, OH, X-) \right]_n$$

where X is $$-\overset{R}{\underset{|}{Ar}}-,$$

Ar is phenylene, R is H or an aliphatic, cycloaliphatic or aromatic group, and n is an integer from 1 to 50 said process consisting essentially of treating said polyaromatic in the absence of moisture with 0.5 to 15% by weight, based on the polyaromatic, of an oxidizing Lewis acid.
2. The process of claim 1, where R is H.
3. The process of claim 1 or 2, wherein X is phenylene.
4. The process of claim 1 or 2, wherein the Lewis acid is selected from the group consisting of $SbF_5$, $AsF_5$ and the nitro salts thereof.

* * * * *